(12) United States Patent
Yuan et al.

(10) Patent No.: US 12,457,872 B2
(45) Date of Patent: Oct. 28, 2025

(54) DISPLAY PANEL AND DISPLAY DEVICE

(71) Applicants: Mianyang HKC Optoelectronics Technology Co., Ltd, Mianyang (CN); HKC CORPORATION LIMITED, Shenzhen (CN)

(72) Inventors: Xin Yuan, Mianyang (CN); Xiufeng Zhou, Mianyang (CN); Haijiang Yuan, Mianyang (CN)

(73) Assignees: MIANYANG HKC OPTOELECTRONICS TECHNOLOGY CO., LTD., Mianyang (CN); HKC CORPORATION LIMITED, Shenzhen (CN)

( * ) Notice: Subject to any disclaimer, the term of this patent is extended or adjusted under 35 U.S.C. 154(b) by 397 days.

(21) Appl. No.: 18/092,141

(22) Filed: Dec. 30, 2022

(65) Prior Publication Data

US 2023/0345784 A1     Oct. 26, 2023

(30) Foreign Application Priority Data

Apr. 24, 2022    (CN) .......................... 202210435831.6

(51) Int. Cl.
*H10K 59/131*     (2023.01)
(52) U.S. Cl.
CPC ....... *H10K 59/1315* (2023.02); *H10K 59/131* (2023.02)

(58) Field of Classification Search
CPC ............. H10K 59/1315; H10K 59/131; H10D 86/441; H10D 86/60; G09F 9/33
See application file for complete search history.

(56) References Cited

U.S. PATENT DOCUMENTS

| | | | |
|---|---|---|---|
| 10,217,802 B2 * | 2/2019 | Hwang | ................. H10K 59/35 |
| 11,482,170 B2 * | 10/2022 | Feng | .................... H10K 59/131 |
| 2005/0057460 A1 | 3/2005 | Lee et al. | |
| 2005/0162353 A1 | 7/2005 | Kanda | |
| 2010/0060147 A1 | 3/2010 | Eom | |
| 2013/0201169 A1 | 8/2013 | Ahn | |

(Continued)

FOREIGN PATENT DOCUMENTS

| | | |
|---|---|---|
| CN | 1645445 A | 7/2005 |
| CN | 102751311 A | 10/2012 |

(Continued)

*Primary Examiner* — Michael M Trinh
(74) *Attorney, Agent, or Firm* — Franklin & Associates International Inc.; Matthew F. Lambrinos

(57) ABSTRACT

The present disclosure relates to a display panel and a display device. The display panel comprises a thin film transistor and a plurality of voltage drain drain signal lines, the thin film transistor comprises a bottom gate and a top gate opposite to each other, the voltage drain drain signal lines are arranged on the same layer as a source electrode and a drain electrode, the display panel further comprises a plurality of voltage dividing wires arranged on the same layer as the bottom gate, the plurality of voltage dividing wires and the plurality of voltage drain drain signal lines intersect with one another to be in grid-shaped distribution, and at least part of intersecting positions of the voltage dividing wires and the voltage drain drain signal lines are electrically connected through via holes.

15 Claims, 4 Drawing Sheets

(56) References Cited

U.S. PATENT DOCUMENTS

| | | | | |
|---|---|---|---|---|
| 2014/0346537 | A1* | 11/2014 | Xi | H10D 86/60 |
| | | | | 257/89 |
| 2017/0345877 | A1 | 11/2017 | Hwang | |
| 2021/0367021 | A1* | 11/2021 | Yang | H10K 59/1216 |
| 2021/0384226 | A1* | 12/2021 | Xin | H10D 86/60 |
| 2021/0408192 | A1 | 12/2021 | Zhang et al. | |
| 2024/0014362 | A1* | 1/2024 | Li | H10H 20/857 |

FOREIGN PATENT DOCUMENTS

| | | |
|---|---|---|
| CN | 107452773 A | 12/2017 |
| CN | 109166886 A | 1/2019 |
| CN | 110148599 A | 8/2019 |
| CN | 111192884 A | 5/2020 |
| CN | 111474790 A | 7/2020 |
| CN | 113345923 A | 9/2021 |
| CN | 113871408 A | 12/2021 |
| CN | 215771146 U | 2/2022 |

* cited by examiner

DISPLAY PANEL AND DISPLAY DEVICE

CROSS REFERENCE TO RELATED APPLICATIONS

The present application claims priority to the Chinese Patent Application No. 202210435831.6, filed on Apr. 24, 2022 and entitled "DISPLAY PANEL AND DISPLAY DEVICE", the entire contents of which are incorporated herein by reference.

FIELD

The present disclosure relates to the technical field of display, in particular to a display panel and a display device.

BACKGROUND

In order to increase an aperture ratio of a display panel, routing design of a voltage drain drain (Vdd) signal line is narrower, especially, when the voltage drain drain signal line is a single line extending longitudinally, an IR Drop phenomenon (voltage drop caused when a current flows through the voltage drain drain signal line) will occur, brightness of the display panel is non-uniform, and a problem of visually visible display mura is prone to occurring.

In order to solve the above problem, an extra metal layer is usually additionally arranged in a backplane circuit in the prior art and is in lap joint with a metal layer where the voltage drain drain signal line is located to form a net-shaped voltage drain drain signal line so as to reduce IR Drop. However, there is an extra photomask manufacture procedure for additionally arranging the metal layer, so that process difficulty is increased.

SUMMARY

Objectives of the present disclosure are to provide a display panel and a display device, which can be designed by using net-shaped voltage drain drain signal lines on the premise of not increasing process difficulty and reduce a problem of display mura caused by IR Drop.

In a first aspect, an embodiment of the present disclosure provides a display panel, including a base substrate and a drive array layer located on the base substrate, the drive array layer comprises a thin film transistor and a plurality of voltage drain drain signal lines, the thin film transistor comprises a bottom gate and a top gate opposite to each other, and a source electrode and a drain electrode located on two sides of the top gate, and the voltage drain drain signal lines are arranged on the same layer as the source electrode and the drain electrode, wherein the drive array layer further comprises a plurality of voltage dividing wires arranged on the same layer as the bottom gate, the plurality of voltage dividing wires and the plurality of voltage drain drain signal lines intersect with one another to be in grid-shaped distribution, and at least part of intersecting positions of the voltage dividing wires and the voltage drain drain signal lines are electrically connected through via holes.

In a second aspect, an embodiment of the present disclosure further provides a display device, including the display panel as described above.

According to the display panel and the display device provided by the embodiments of the present disclosure, the plurality of voltage dividing wires are arranged on the same layer as a metal layer where the bottom gate of the thin film transistor is located, and the voltage dividing wires and the plurality of voltage drain drain signal lines intersect with one another to be in grid-shaped distribution, at least part of the intersecting positions of the voltage dividing wires and the voltage drain drain signal lines are electrically connected through the via holes, so the voltage dividing wires may be designed by using the net-shaped voltage drain drain signal lines on the premise of not increasing process difficulty, and the problem of display mura caused by IR Drop is reduced.

BRIEF DESCRIPTION OF THE DRAWINGS

Features, advantages and technical effects of the exemplary embodiments of the present disclosure will be described below with reference to accompanying drawings. In the accompanying drawings, the same reference numeral is used for the same component. The accompanying drawings are drawn not according to an actual scale and are only used to illustrate a relative position relationship, a layer thickness of some parts adopts an exaggerated drawing mode for convenient understanding, and the layer thickness in the accompanying drawings does not represent a proportional relation of an actual layer thickness.

Figure 1:
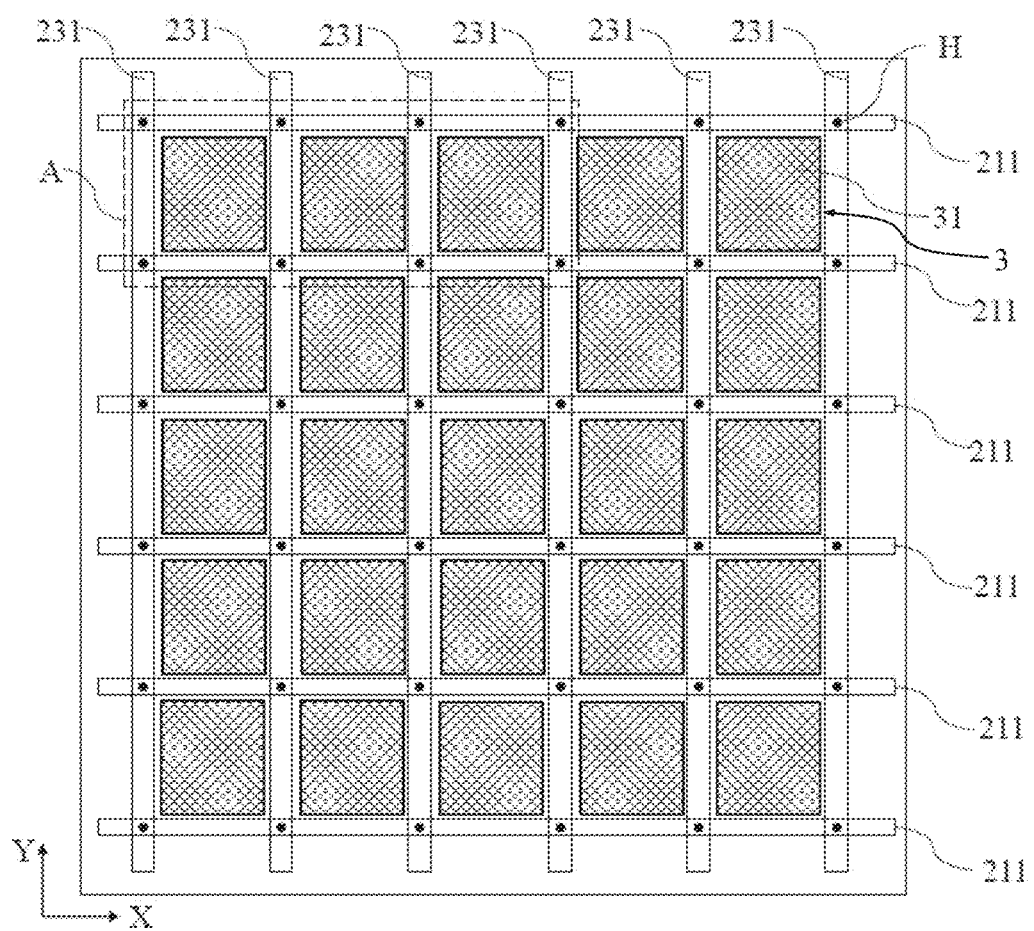
FIG. 1 shows a schematic structural top view of a display panel provided by Embodiment 1 of the present disclosure.

DESCRIPTION OF THE REFERENCE NUMERALS 1, base substrate; X, first direction; Y, second direction;
2a, thin film transistor; G1, bottom gate; G2, top gate; S, source electrode, D, drain electrode; ACT, semiconductor layer; H, via hole;
21, first metal layer; 211, voltage dividing wire; 211a, voltage dividing wire segment;
22, second metal layer; 221, connection part; 222, scan line;
23, third metal layer; 231, voltage drain drain signal line; 232, data line;
24, first insulation layer; 241, buffer layer; 242, gate insulation layer; H1, first via hole; H3, third via hole;
25, second insulation layer; H2, second via hole; 26, passivation layer; 27, planarization layer;
3, luminous layer; 31, sub-pixel; 311, first electrode.

DETAILED DESCRIPTION OF THE EMBODIMENTS

Features and exemplary embodiments in all aspects of the present disclosure will be described below in detail. In the following detailed description, many specific details are provided for providing comprehensive understanding for the present disclosure. However, it is quite apparent to those skilled in the art that the present disclosure may be implemented without some details in these specific details. The following description of the embodiments is merely for showing examples of the present disclosure to provide better understanding for the present disclosure. In the accompanying drawings and the following description, at least part of known structures and techniques are not shown so as to avoid unnecessary obscureness for the present disclosure, and moreover, for the sake of being clear, a size of a region structure may be exaggerated. Besides, the following described features, structures or characteristics may be incorporated in one or more embodiments in any appropriate mode.

A display panel provided by an embodiment of the present disclosure may be designed by adopting a net-shaped voltage drain drain signal line on the premise of not increasing process difficulty so as to reduce a problem of display mura caused by IR Drop. A specific structure of a display panel provided by each embodiment is described below in detail with reference to the accompanying drawings.

Embodiment 1

Figure 2:
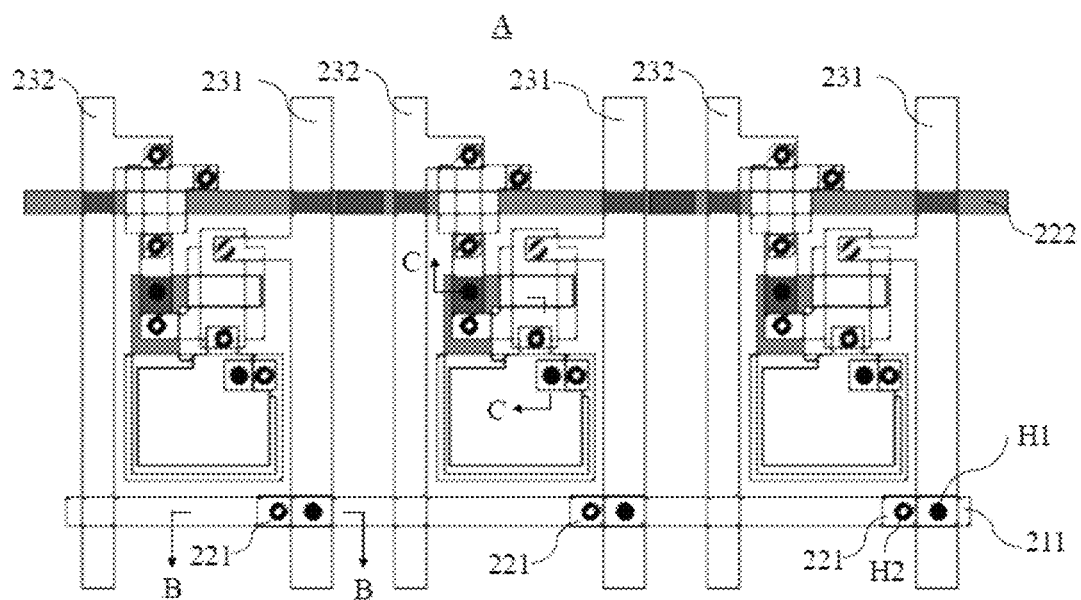
FIG. 2 shows a structural enlarged view of a region A in FIG. 1.
Figure 3:
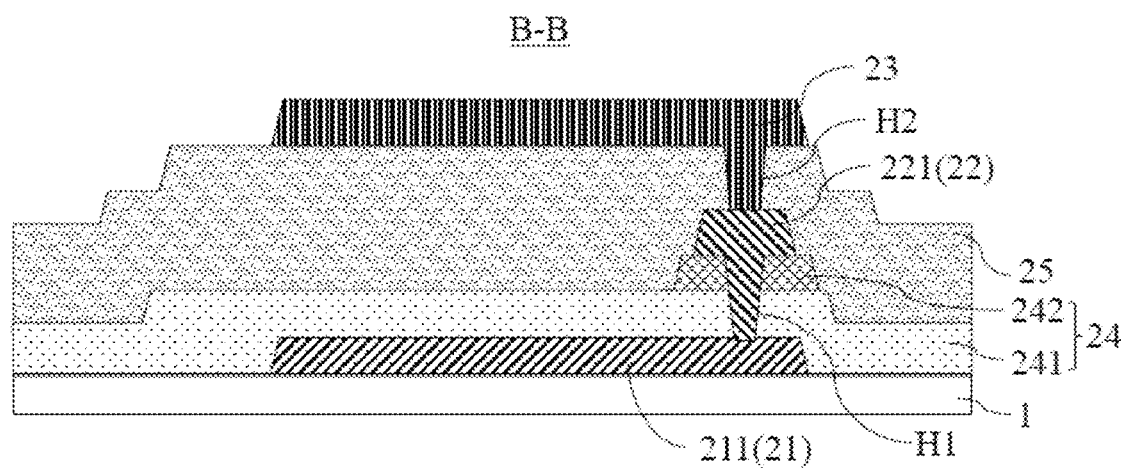
FIG. 3 shows a sectional view in a direction B-B in FIG. 2.
Figure 4:
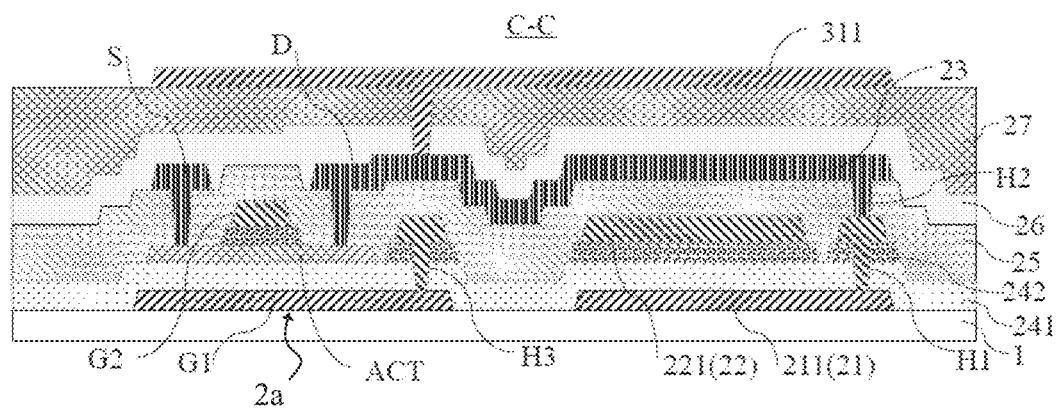
FIG. 4 shows a sectional view in a direction C-C in FIG. 2.

FIG. 1 shows a schematic structural top view of a display panel provided by Embodiment 1 of the present disclosure. FIG. 2 shows a structural enlarged view of a region A in FIG. 1. FIG. 3 shows a sectional view in a direction B-B in FIG. 2. FIG. 4 shows a sectional view in a direction C-C in FIG. 2.

As shown in FIG. 1 to FIG. 4, the display panel provided by embodiment 1 of the present disclosure comprises a base substrate 1 and a drive array layer located on the base substrate 1. The drive array layer comprises a thin film transistor 2a and a plurality of voltage drain drain signal lines 231. The thin film transistor 2a comprises a bottom gate G1 and a top gate G2 opposite to each other, and a source electrode S and a drain electrode D located on two sides of the top gate G2. The voltage drain drain signal lines 231 are arranged on the same layer as the source electrode S and the drain electrode D.

The drive array layer further comprises a plurality of voltage dividing wires 211 arranged on the same layer as the bottom gate G1. The plurality of voltage dividing wires 211 and the plurality of voltage drain drain signal lines 231 intersect with one another to be in grid-shaped distribution. At least part of intersecting positions of the voltage dividing wires 211 and the voltage drain drain signal lines 231 are electrically connected through via holes H.

In some embodiments, the drive array layer comprises a first metal layer 21, a second metal layer 22 and a third metal layer 23 arranged in stack in sequence in a direction away from the base substrate 1. The first metal layer 21 comprises the bottom gate of the thin film transistor 2a. The second metal layer 22 comprises the top gate of the thin film transistor 2a. The third metal layer 23 comprises the plurality of voltage drain drain signal lines 231. In some embodiments, a material of the base substrate 1 may be glass, transparent resin, quartz, sapphire and the like. In some embodiments, materials of the first metal layer 21, the second metal layer 22 and the third metal layer 23 comprise aluminum or an aluminum alloy, and conductivity and a bending feature of metal wires are improved, so as to lower a risk of wire breaking caused by dynamic bending.

In some embodiments, the plurality of voltage drain drain signal lines 231 located on the third metal layer 23 and the plurality of voltage dividing wires 211 located on the first metal layer 21 intersect with one another to be in grid-shaped distribution, and at least part of the intersecting positions of the voltage dividing wires 211 and the voltage drain drain signal lines 231 are electrically connected through the via holes H to form a double-layer wire structure. In some embodiments, the via hole H is formed in each intersecting position of the voltage dividing wires 211 and the voltage drain drain signal lines 231, and the more the via holes H, the better the sharing effect of a current, so that an electrical resistance value of the voltage drain drain signal lines 231 can be reduced, a voltage loss drop value is reduced, uniformity of the electrical resistance in the whole display panel is improved, and thus brightness uniformity of the display panel is improved.

Besides, the voltage drain drain signal lines 231 adopt a double-layer wire structure, the voltage dividing wires 211 and the voltage drain drain signal lines 231 are connected in parallel, and when a circuit of a certain layer is off, a circuit of another layer may be switched on, so reliability of the display panel is improved.

In some embodiments, the voltage dividing wires 211 and the bottom gate G1 of the thin film transistor 2a are located on the first metal layer 21 and may be fabricated on the same layer. On the one hand, compared with the technical solution of arranging the voltage dividing wires 211 by additionally arranging an extra metal layer in the prior art, a photomask manufacture procedure may be omitted, the process difficulty is not increased, and manufacturing cost is reduced advantageously. In a second aspect, the bottom gate G1 serves as part of the thin film transistor 2a and has a small occupied area in the whole first metal layer 21, there is enough space for arranging the voltage dividing wires 211, and an influence on an aperture ratio is relatively small. If the voltage dividing wires 211 are arranged on other film layers, such as the second metal layer 22, as various signal lines need to be arranged on the second metal layer 22, the voltage dividing wires 211 will occupy more wiring space, so that the aperture ratio of the display panel is affected. In a third aspect, the first metal layer 21 and the third metal layer 23 are spaced by a plurality of film layers, such as the second metal layer 22, a distance between the first metal layer 21 and the third metal layer 23 is long, a stray capacitance between the two is small, a load of the voltage drain drain signal lines 231 is reduced advantageously, and display performance of the display panel is improved.

According to the display panel provided by the embodiment of the present disclosure, the plurality of voltage dividing wires 211 are arranged on the same layer as the metal layer where the bottom gate of the thin film transistor 2a is located, the voltage dividing wires 211 intersect with the plurality of voltage drain drain signal lines 231 to be in grid-shaped distribution, at least part of intersecting positions of the voltage dividing wires 211 and the voltage drain drain signal lines 231 are electrically connected through via holes H, so the voltage dividing wires 211 may be designed by adopting the net-shaped voltage drain drain signal lines on the premise of not increasing the process difficulty, and the problem of display mura caused by IR Drop is reduced.

In some embodiments, the display panel further comprises a luminous layer 3 located on a side of the drive array layer facing away from the base substrate 1, and the luminous layer 3 comprises a plurality of sub-pixels 31 distributed in array. The voltage dividing wires 211 extend in a first direction X, the voltage drain drain signal lines 231 extend in a second direction Y intersecting with the first direction X, and at least one sub-pixel 31 is arranged in each grid defined by intersecting of the voltage dividing wires 211 and the voltage drain drain signal lines 231.

As shown in FIG. 1, the plurality of sub-pixels 31 are distributed in array in the first direction X and the second direction Y, and one sub-pixel 31 is arranged in each grid defined by intersecting of the voltage dividing wires 211 and the voltage drain drain signal lines 231, that is, the plurality of grids are in one-to-one correspondence with the plurality of sub-pixels 31. Each grid is formed by intersecting of every two adjacent voltage drain drain signal lines 231 and every two adjacent voltage dividing wires 211, four intersecting positions of each grid are each provided with one via hole H, so the voltage dividing wires 211 can share a current of the voltage drain drain signal lines 231, and an IR-Drop degree of the voltage drain drain signal lines 231 is reduced.

In other words, a plurality of intersecting points distributed in array are formed after the plurality of voltage drain drain signal lines 231 and the plurality of voltage dividing wires 211 intersect, and the more the via holes H formed in the intersecting points, the better the sharing effect of the current, so that the current can be shared in a whole surface of the display panel, then the IR-Drop degree in the whole surface is reduced, and brightness uniformity of the display panel is improved.

In some embodiments, the drive array layer further comprises a connection part 221 arranged on the same layer as the top gate G2, an orthographic projection of the connection part 221 on the base substrate 1 at least partially overlaps with an orthographic projection of the voltage dividing wires 211 and the voltage drain drain signal lines 231 on the base substrate 1 respectively, and the via holes H are in lap joint with the connection part 221. Herein, "lap joint" refers to that the via holes H are filled with metal in a depth direction between the third metal layer 23 and the first metal layer 21, the connection part 221 located on the second metal layer 22 divides the metal in the via holes H into two parts, the two parts of metal are interconnected through the connection part 221, and thus electrical connection between the voltage dividing wires 211 and the voltage drain drain signal lines 231 is realized. Through holes of the via holes H located on two sides of the connection part 221 in the depth direction may be aligned or staggered.

As shown in FIG. 3 and FIG. 4, as the first metal layer 21 and the third metal layer 23 are spaced by the plurality of film layers, such as the second metal layer 22, the distance between the first metal layer 21 and the third metal layer 23 is long, the via holes H are deep, alignment accuracy of the via holes H between all the film layers is hardly guaranteed, and electrical connection performance of the voltage drain drain signal lines 231 and the voltage dividing wires 211 is affected. In order to improve the electrical connection performance of the voltage drain drain signal lines and the voltage dividing wires and simplify a manufacturing process, the connection part 221 may be arranged on the second metal layer 22, and the via holes H are in lap joint with the connection part 221. In this way, a distance between the connection part 221 of the second metal layer 22 and the voltage dividing wire 211 of the first metal layer 21 and a distance between the connection part 221 and the voltage drain drain signal line 231 of the third metal layer 23 are relatively short, a depth of the via hole H on the two sides of the connection part 221 is reduced, and the electrical connection performance of the voltage drain drain signal lines 231 and the voltage dividing wires 211 is improved advantageously.

In some embodiments, the drive array layer further comprises a first insulation layer 24 and a second insulation layer 25. The first insulation layer 24 is located between the voltage dividing wires 211 and the connection part 221. The second insulation layer 25 is located between the connection part 221 and the voltage drain drain signal lines 231. The via holes H comprise a first via hole H1 and a second via hole H2 which are in lap joint with the connection part 221 respectively, the first via hole H1 penetrates through the first insulation layer 24, and the second via hole H2 penetrates through the second insulation layer 25.

In some embodiments, the first insulation layer 24 comprises a buffer layer 241 and a gate insulation layer 242, and the first via hole H1 penetrates through the buffer layer 241 and the gate insulation layer 242. The second insulation layer 25 is an interlayer insulation layer, and the second via hole H2 penetrates through the interlayer insulation layer. As the first via hole H1 and the second via hole H2 are in lap joint with the connection part 221 respectively, an electrical connection is realized, and the first via hole H1 and the second via hole H2 do not need to be aligned in the depth direction, so a manufacturing process is simplified.

In some embodiments, an orthographic projection of the first via hole H1 on the base substrate 1 overlaps with an orthographic projection of the second via hole H2 on the base substrate 1. When the first via hole H1 and the second via hole H2 are aligned in the depth direction, occupied space can be reduced, and the aperture ratio is increased advantageously.

In some embodiments, a third via hole H3 is further formed in the first insulation layer 24, and the top gate G2 is electrically connected with the bottom gate G1 through the third via hole H3.

As shown in FIG. 2, the second metal layer 22 further comprises a scan line 222 extending in the first direction X, the third metal layer 23 further comprises a data line 232 extending in the second direction Y, and the data line 232 is adjacent to the voltage drain drain signal lines 231. The scan line 222 is electrically connected with the top gate G2 of the thin film transistor 2a, and the data line 232 is electrically connected with the source electrode S of the thin film transistor 2a.

As shown in FIG. 4, an active layer ACT is further formed between the buffer layer 241 and the gate insulation layer 242, an orthographic projection of the bottom gate G1 on the base substrate 1 covers an orthographic projection of the active layer ACT on the base substrate 1, so an unfavorable influence on the thin film transistor 2a by outside light can be prevented. Besides, the top gate G2 is electrically connected with the bottom gate G1 through the third via hole H3, a gate of the thin film transistor 2a adopts a double-layer wire structure, and a load of the scan line 222 electrically connected with the gate can be reduced.

In some embodiments, each sub-pixel 31 comprises a first electrode 311, a luminous structure and a second electrode arranged in stack in sequence, the first electrode 311 is electrically connected with the source electrode S or the drain electrode D of the thin film transistor 2a, and the second electrode is a transparent conductive layer.

Any one of the first electrode 311 and the second electrode is an anode of the sub-pixel 31, and the other one is a cathode of the sub-pixel 31. In the present disclosure, description is made by taking the first electrode 311 being the anode as an example, the second electrode is the transparent conductive layer, that is, the cathode is the transparent conductive layer, and light is convenient to emit.

One sub-pixel 31 is arranged in each grid defined by intersecting of the voltage dividing wires 211 and the voltage drain drain signal lines 231, the first electrode 311 of the sub-pixel 31 is electrically connected with the drain electrode D of the thin film transistor 2a, and the source electrode S of the thin film transistor 2a is electrically connected with the data line 232.

Besides, the display panel further comprises a pixel defining layer, the pixel defining layer is located on a side of the drive array layer facing away from the base substrate 1 and comprises a plurality of pixel openings, and the at least part of the sub-pixels 31 are located in the pixel openings. Specifically, the luminous structure and the second electrode of each sub-pixel 31 are located in the pixel openings, and the first electrodes 311 correspond to the pixel openings.

Embodiment 2

Figure 5:
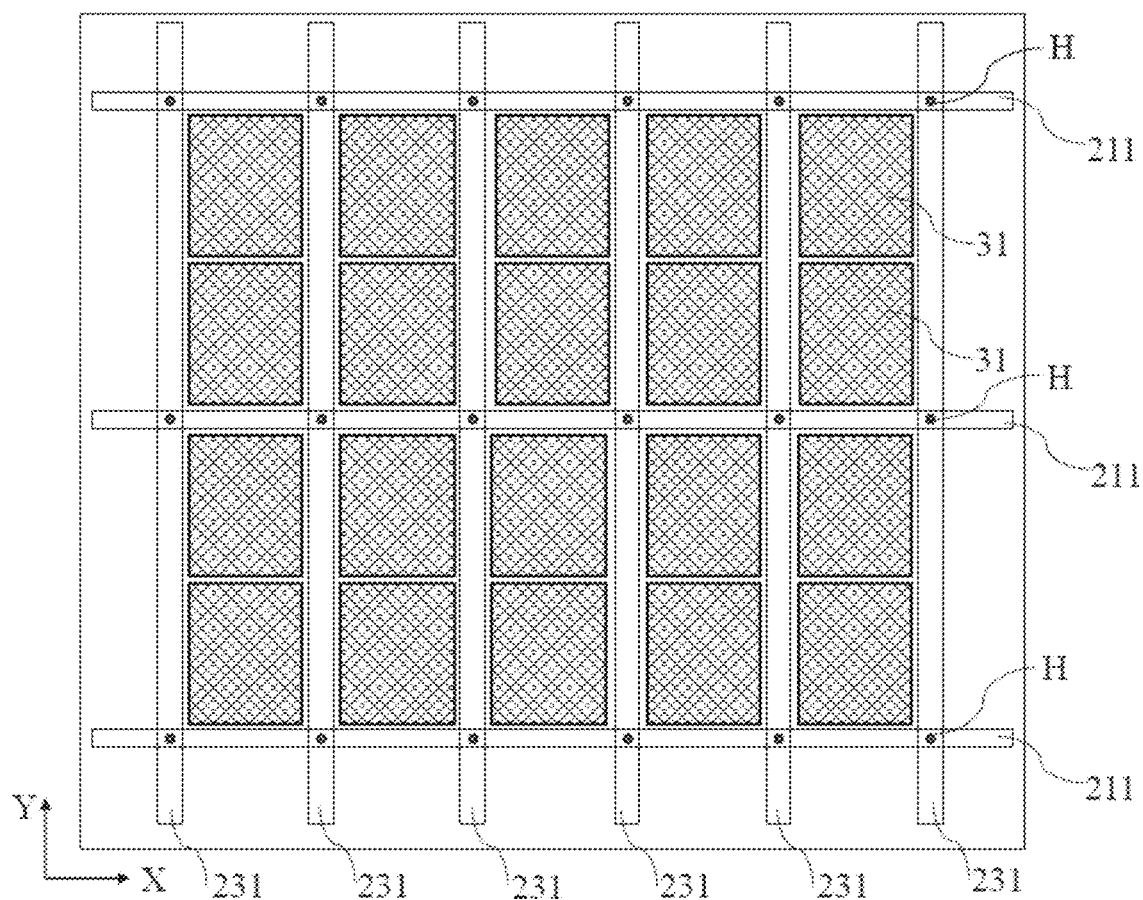
FIG. 5 shows a schematic structural top view of a display panel provided by Embodiment 2 of the present disclosure.

FIG. 5 shows a schematic structural top view of a display panel provided by Embodiment 2 of the present disclosure.

As shown in FIG. 5, Embodiment 2 of the present disclosure further provides a display panel with a structure similar to that of the display panel provided by Embodiment 1, and the two display panels differ in arrangement of voltage dividing wires 211.

In some embodiments, the display panel comprises a luminous layer 3 located on a side of a drive array layer facing away from a base substrate 1, and the luminous layer 3 comprises a plurality of sub-pixels 31 distributed in an array. Voltage dividing wires 211 extend in a first direction X, voltage drain drain signal lines 231 extend in a second direction Y intersecting with the first direction X, and two sub-pixels 31 are arranged in each grid defined by intersecting of the voltage dividing wires 211 and the voltage drain drain signal lines 231.

As shown in FIG. 5, the voltage drain drain signal lines 231 and a data line 232 extend in the second direction Y and are adjacent, the voltage dividing wires 211 and a scan line (not shown in the figure) extend in the first direction X, the voltage dividing wires 211 and the scan line are spaced by a preset distance, and thus grids defined by intersecting of the voltage dividing wires 211 and the voltage drain drain signal lines 231 are large grids. Two sub-pixels 31 aligned in the second direction Y are formed in each large grid. As no wire exists between the two sub-pixels 31, wiring space is saved, a size of each sub-pixel 31 may be larger, and an aperture ratio of the display panel is increased.

It can be understood that more sub-pixels 31 may also be arranged in each grid defined by intersecting of the voltage dividing wires 211 and the voltage drain drain signal lines 231. Meanwhile, as the more the sub-pixels 31, the fewer positions of intersecting points, it is not good for IR-drop reduction, and a balance between the wiring space and the IR-Drop needs to be considered, which is determined according to specific design demands.

Embodiment 3

Figure 6:
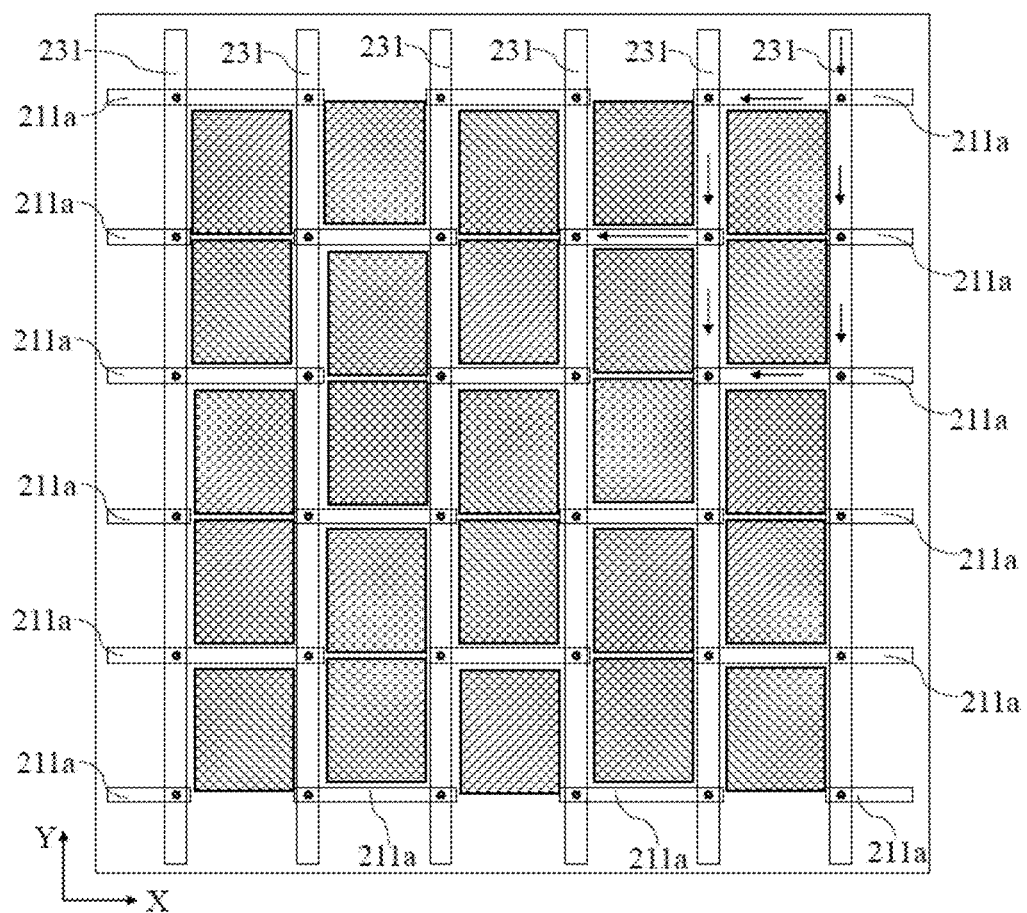
FIG. 6 shows a schematic structural top view of a display panel provided by Embodiment 3 of the present disclosure.

FIG. 6 shows a schematic structural top view of a display panel provided by Embodiment 3 of the present disclosure.

As shown in FIG. 6, Embodiment 3 of the present disclosure further provides a display panel with a structure similar to that of the display panel provided by Embodiment 1, and the two display panels differ in arrangement of the voltage dividing wires 211.

In some embodiments, each voltage dividing wire 211 comprises a plurality of voltage dividing wire segments 211a distributed in a spaced mode in a first direction X, two ends of each voltage dividing wire segment 211a are electrically connected with two adjacent voltage drain drain signal lines 231 respectively, and the voltage dividing wire segments 211a of every two adjacent voltage dividing wires 211 are staggered in the first direction X.

As shown by an arrow at an upper right corner of FIG. 6, when a current flowing into one side of one voltage drain drain signal line 231 passes through an intersecting point of the voltage drain drain signal line and the voltage dividing wire segment 211a, one part of the current is guided into the voltage dividing wire segment 211a through a via hole H, the other part of the current continues flows along the voltage drain drain signal line 231, the current entering the voltage dividing wire segment 211a is cut off when passing through an intersecting point with the other voltage drain drain signal line 231 and is guided into the other voltage drain drain signal line 231 through the via hole H, and thus the current entering each voltage drain drain signal line 231 flows between a third metal layer 23 and a first metal layer 21 so as to be jointly shared.

In some embodiments, in a second direction Y, two aligned sub-pixels 31 are formed between every two adjacent voltage dividing wire segments 211a. As no wire exists between the two sub-pixels 31, wiring space is saved, a size of the sub-pixel 31 may be larger, and an aperture ratio of the display panel is increased.

In some embodiments, the voltage dividing wires 211 are segmented, transverse wires of a column of sub-pixels 31 in the first direction X may be reduced by half, and transverse intervals of two adjacent columns of sub-pixels 31 are staggered. Compared with a small-grid design of Embodiment 1, the quantity of intersecting points is the same, a sharing effect of the current is the same, but design space of the sub-pixels 31 may be increased, and the aperture ratio is increased. Compared with a large-grid design of Embodiment 2, the quantity of the intersecting points is larger, a load of the voltage drain drain signal lines 231 is reduced, the sharing effect of the current is better, and uniformity of the display brightness is improved advantageously.

Therefore, the voltage dividing wires 211 provided by the embodiment have the same quantity of intersecting points as a small-grid structure, the same current sharing effect is realized, and an IR-Drop degree can be reduced. Meanwhile, advantages of saving the space and increasing the aperture ratio of the large-grid design are realized, and the balance between the wiring space and the IR-Drop is considered.

Besides, the embodiment of the present disclosure further provides a display device, including any display panel as described above. The display device may be but is not limited to, a wearable device, a mobile phone, a tablet computer, a television, a display, a notebook computer, an electronic book, electronic newspapers, a digital photo frame, a navigator and any product or component with a display function. The wearable device comprises a smart bracelet, a smartwatch, a virtual reality (VR) device and the like.

It should be easily understood that "on . . . ", "above . . . " and "over . . . " in the present disclosure should be explained in a broadest sense so that "on . . . " not only means "directly located on something", but also comprises "on the something" and means having an intermediate feature or a layer between them, moreover, "above . . . " or "over . . . " not only comprises a meaning of "above something" or "above", but also may comprise "above something" or "above" and means having no intermediate feature or layer between them (namely, directly located on something).

A term "base substrate" used herein means adding a material of subsequent material layers thereon. The base substrate per se may be patterned. The material added to a top of the base substrate may be patterned or not. Besides, the base substrate may comprise a series of materials within a wide range, for example, silicon, germanium, gallium arsenide and indium phosphide. Alternatively, the base substrate may be made of a non-conductive material (for example, glass, plastics or a sapphire wafer).

A term "layer" used herein may refer to including a material part of a region with a certain thickness. The layer may extend on a whole lower-layer structure or an upper cover structure, or may have a range smaller than a range of the lower-layer structure or the upper cover structure. Besides, the layer may be a region of a homogeneous or non-homogeneous continuous structure, and a thickness thereof is smaller than a thickness of the continuous structure. For example, the layer may be located between a top surface and a bottom surface of the continuous structure or between any pairwise transverse planes at the top surface and the bottom surface. The layer may extend transversely, vertically and/or along a tapered surface. The base substrate may be a layer and may comprise one or more layers therein, and/or may have one or more layers located on it, above it and/or below it. The layer may comprise a plurality of layers. For example, an interconnected layer may comprise one or more conductors and contact layers (forming a contact, interconnected lines and/or via holes therein) and one or more dielectric layers.

It should be finally noted that the above embodiments are merely used for describing technical solutions of the present disclosure instead of limiting them; although the present disclosure is described in detail with reference to the above embodiments, those ordinarily skilled in the art should understand that modifications can be still made to the technical solutions recorded in the above embodiments, or part or all of technical features therein are replaced equivalently; and these modifications or replacements do not make the essence of the corresponding technical solutions depart from the scope of the technical solutions of all the embodiments of the present disclosure.

What is claimed is:

1. A display panel, comprising a base substrate and a drive array layer located on the base substrate, wherein the drive array layer comprises a thin film transistor and a plurality of voltage drain drain signal lines, the thin film transistor comprises a bottom gate and a top gate opposite to each other and a source electrode and a drain electrode located on two sides of the top gate, the voltage drain drain signal lines are arranged on a same layer as the source electrode and the drain electrode, the drive array layer further comprises a plurality of voltage dividing wires arranged on a same layer as the bottom gate, the plurality of voltage dividing wires and the plurality of voltage drain drain signal lines intersect with one another to be in grid-shaped distribution, and at least part of intersecting positions of the voltage dividing wires and the voltage drain drain signal lines are electrically connected through via holes.

2. The display panel according to claim 1, further comprising a luminous layer located on a side of the drive array layer facing away from the base substrate, wherein the luminous layer comprises a plurality of sub-pixels distributed in an array; and the voltage dividing wires extend in a first direction, the voltage drain drain signal lines extend in a second direction intersecting with the first direction, and at least one sub-pixel is arranged in each grid defined by intersecting of the voltage dividing wires and the voltage drain drain signal lines.

3. The display panel according to claim 2, wherein each voltage dividing wire comprises a plurality of voltage dividing wire segments spaced in the first direction, two ends of each voltage dividing wire segment are electrically connected with two adjacent voltage drain drain signal lines respectively, and the voltage dividing wire segments of every two adjacent voltage dividing wires are staggered in the first direction.

4. The display panel according to claim 3, wherein in the second direction, two aligned sub-pixels are formed between every two adjacent voltage dividing wire segments.

5. The display panel according to claim 1, wherein the drive array layer further comprises a connection part arranged on a same layer as the top gate, an orthographic projection of the connection part on the base substrate at least partially overlaps with an orthographic projection of the voltage dividing wires and the voltage drain drain signal line on the base substrate respectively, and the via holes are in lap joint with the connection part.

6. The display panel according to claim 5, wherein the drive array layer further comprises a first insulation layer and a second insulation layer, the first insulation layer is located between the voltage dividing wires and the connection part, the second insulation layer is located between the connection part and the voltage drain drain signal lines, the via holes comprise a first via hole and a second via hole which are in lap joint with the connection part respectively, the first via hole penetrates through the first insulation layer, and the second via hole penetrates through the second insulation layer.

7. The display panel according to claim 6, wherein an orthographic projection of the first via hole on the base substrate overlaps with an orthographic projection of the second via hole on the base substrate.

8. The display panel according to claim 6, wherein the first insulation layer is further provided with a third via hole, and the top gate is electrically connected with the bottom gate through the third via hole.

9. The display panel according to claim 2, wherein each sub-pixel comprises a first electrode, a luminous structure and a second electrode arranged in stack in sequence, the first electrode is electrically connected with the source electrode or the drain electrode of the thin film transistor, and the second electrode is a transparent conductive layer.

10. The display panel according to claim 1, wherein each grid is formed by intersecting of every two adjacent voltage drain drain signal lines and every two adjacent voltage dividing wires, and four intersecting positions of each grid are each provided with one via hole.

11. The display panel according to claim 2, wherein one sub-pixel is arranged in each grid defined by intersecting of the voltage dividing wires and the voltage drain drain signal lines.

12. The display panel according to claim 2, wherein two sub-pixels are arranged in each grid defined by intersecting of the voltage dividing wires and the voltage drain drain signal lines.

13. The display panel according to claim 6, wherein the first insulation layer comprises a buffer layer and a gate insulation layer, an active layer is further formed between the buffer layer and the gate insulation layer, and an orthographic projection of the bottom gate on the base substrate covers an orthographic projection of the active layer on the base substrate.

14. The display panel according to claim 2, wherein the display panel further comprises a pixel defining layer, the pixel defining layer is located on a side of the drive array layer facing away from the base substrate, the pixel defining layer comprises a plurality of pixel openings, and at least part of the sub-pixels are located in the pixel openings.

15. A display device, comprising a display panel, wherein the display panel comprises a base substrate and a drive array layer located on the base substrate, the drive array layer comprises a thin film transistor and a plurality of voltage drain drain signal lines, the thin film transistor comprises a bottom gate and a top gate opposite to each other and a source electrode and a drain electrode located on two sides of the top gate, the voltage drain drain signal lines are arranged on a same layer as the source electrode and the drain electrode, the drive array layer further comprises a plurality of voltage dividing wires arranged on a same layer as the bottom gate, the plurality of voltage dividing wires and the plurality of voltage drain drain signal lines intersect with one another to be in grid-shaped distribution, and at least part of intersecting positions of the voltage dividing wires and the voltage drain drain signal lines are electrically connected through via holes.

* * * * *